(12) United States Patent
Laurent

(10) Patent No.: US 6,715,121 B1
(45) Date of Patent: Mar. 30, 2004

(54) SIMPLE AND SYSTEMATIC PROCESS FOR CONSTRUCTING AND CODING LDPC CODES

(75) Inventor: Pierre André Laurent, Bessancourt (FR)

(73) Assignee: Thomson-CSF, Paris (FR)

(*) Notice: Subject to any disclaimer, the term of this patent is extended or adjusted under 35 U.S.C. 154(b) by 484 days.

(21) Appl. No.: 09/686,873

(22) Filed: Oct. 12, 2000

(30) Foreign Application Priority Data

Oct. 12, 1999 (FR) .......................................... 99 12710

(51) Int. Cl.$^7$ .............................................. H03M 13/00
(52) U.S. Cl. ...................................... 714/758; 714/800
(58) Field of Search ................................. 714/752, 746, 714/768, 758, 800, 799, 804, 786, 757, 805, 803, 802, 801; 341/50

(56) References Cited

U.S. PATENT DOCUMENTS

| | | | |
|---|---|---|---|
| 4,027,261 A | | 5/1977 | Laurent et al. |
| 4,382,232 A | | 5/1983 | Laurent |
| 4,603,393 A | | 7/1986 | Laurent et al. |
| 4,799,241 A | | 1/1989 | Laurent |
| 4,852,098 A | | 7/1989 | Brechard et al. |
| 4,888,778 A | | 12/1989 | Brechard et al. |
| 4,905,256 A | | 2/1990 | Laurent |
| 4,945,312 A | | 7/1990 | Auger et al. |
| 4,982,341 A | | 1/1991 | Laurent |
| 5,016,278 A | | 5/1991 | Rochette et al. |
| 5,243,685 A | | 9/1993 | Laurent |
| 5,313,553 A | | 5/1994 | Laurent |
| 5,412,667 A | * | 5/1995 | Havemose ................. 714/756 |
| 5,425,038 A | * | 6/1995 | Chen ........................ 714/755 |
| 5,522,009 A | | 5/1996 | Laurent |
| 5,537,427 A | | 7/1996 | Chen |
| 5,600,659 A | * | 2/1997 | Chen ........................ 714/752 |
| 5,745,507 A | * | 4/1998 | Chen ........................ 714/763 |
| 5,757,823 A | * | 5/1998 | Chen et al. ................. 714/752 |
| 5,768,294 A | * | 6/1998 | Chen et al. ................. 714/766 |
| 5,872,798 A | * | 2/1999 | Baggen et al. .............. 714/755 |
| 6,016,469 A | | 1/2000 | Laurent |
| 6,195,777 B1 | * | 2/2001 | Luby et al. ................. 714/752 |
| 6,307,487 B1 | * | 10/2001 | Luby ......................... 341/50 |
| 6,320,520 B1 | * | 11/2001 | Luby ......................... 341/50 |
| 6,463,563 B1 | * | 10/2002 | Chen et al. ................. 714/768 |

OTHER PUBLICATIONS

David J. Mackay, "Good Error–Correcting Codes Based on Very Sparse Matrices", IEEE Transactions on Information theory, Mar. 1999, vol. 45, No. 2, pp. 399–431.

Li Ping, et al., "Low Density Parity Check Codes with Semi–Random Parity Check Matrix", Electronics Letters, Jan. 7, 1999, vol. 35, No. 1, XP002143043, pp. 38–39.

X.–H. Peng, et al., "Efficient Permutation Criterion for Obtaining Minimal Trellis of a Block Code", Electronics Letters, May 23, 1996, vol. 32, No. 11, XP000599121, pp. 983–984.

J. Boutrost, et al., "Generalized Low Density (Tanner) Codes", 1999 IEEE International Conference on Communications (Cat. No. 99CH36311), Jun. 6–10, 1999, vol. 1, XP002143044, pp. 441–445.

Richard E. Blahut, "Theory and Practice of Error Control Codes ISBN: 0–201–10102–5", XP002143045, pp. 47–49.

\* cited by examiner

*Primary Examiner*—Albert Decady
*Assistant Examiner*—Mujtaba Chaudry
(74) *Attorney, Agent, or Firm*—Oblon, Spivak, McClelland, Maier & Neustadt, P.C.

(57) ABSTRACT

A process for the construction of LDPC codes including N symbols, of which K are free, each code being defined by a check matrix A including M=N−K rows, N columns, and t nonzero symbols in each column. The method includes allocating the same number of nonzero symbols to all the rows of the check matrix A, taking t to be the smallest possible odd number, defining the columns of A such that any two columns of the check matrix A have at most one nonzero value in a common position, and defining the rows of A such that any two rows of the check matrix A have only one nonzero value in a common position.

4 Claims, 4 Drawing Sheets

SIMPLE AND SYSTEMATIC PROCESS FOR CONSTRUCTING AND CODING LDPC CODES

BACKGROUND OF THE INVENTION

The present invention relates to a simple and systematic process for constructing and coding codes which are known by the abbreviation LDPC standing for "Low Density Parity Check".

Gallager's codes, proposed around 1963, are the progenitor of the LDPC codes currently envisaged as an alternative to turbocodes.

An article published in the IEEE journal Transaction on Information Theory, Vol. 45 No. 2, March 1999 by M. J. C. MacKay entitled "Good Error Correcting Codes Based on very Sparse Matrices" presents interesting results regarding these codes, in particular the fact that:

- for blocks of large size, they are asymptotically "very good codes"
- the weighted decoding (or "soft decoding" or "flexible decoding") is easy to implement.

However, there is no method other than heuristic for constructing them.

According to this coding technique a code (N, K) comprising N symbols, of which K are free, is defined by its parity check matrix A comprising M=N-K rows and N columns.

The check matrix A is characterized by its low "density": this should be understood to mean that it comprises a small number of nonzero elements.

More precisely, it comprises exactly t nonzero symbols in each column, all the others being equal to 0.

If the symbols of a code word are denoted ci, i=0 ... N-1 and the elements of the check matrix Aij, the code satisfies M=N-K relations of the form:

$$\sum_{i=0 \ldots N-1} A_{mi} C_i \text{ for } m = 0 \ldots M - 1$$

The methods proposed by M. J. C. MacKay consist in building an initial matrix A from smaller unit matrices or tridiagonal matrices, then in permuting their columns so as to arrive at the desired result. Experience shows, however, that it is difficult to satisfy the various constraints imposed in respect of their construction.

The aim of the invention is to alleviate the aforesaid drawbacks.

SUMMARY OF THE INVENTION

To this end the subject of the invention is a process for constructing LDPC codes comprising N symbols, of which K are free, each code being defined by a check matrix A comprising M=N-K rows N columns and t nonzero symbols in each column, which process consists:

a—in allocating the same number of nonzero symbols "t" to all the rows of the check matrix A,
b—in taking as number of symbols "t" the smallest possible odd number,
c—in defining the columns in such a way that any two columns of the check matrix A have at most only one nonzero value,
d—and in defining the rows in such a way that two rows of the check matrix A have only one nonzero common value.

The process according to the invention has the advantage that it makes it possible to simplify the coding and decoding algorithms by using a check matrix A having the lowest possible density whilst giving good performance for reasonable complexity, the computational power required being proportional to the number t. Insofar as there are few errors, constraint "c" above allows the decoding algorithm to converge in all circumstances.

DESCRIPTION OF THE FIGURES

Other characteristics and advantages of the invention will become apparent with the aid of the description which follows with regard to the appended drawings which represent:

FIGS. 6 to 9, a switching matrix, computing the redundancy symbols.

DETAILED DESCRIPTION OF THE INVENTION

Figure 1:
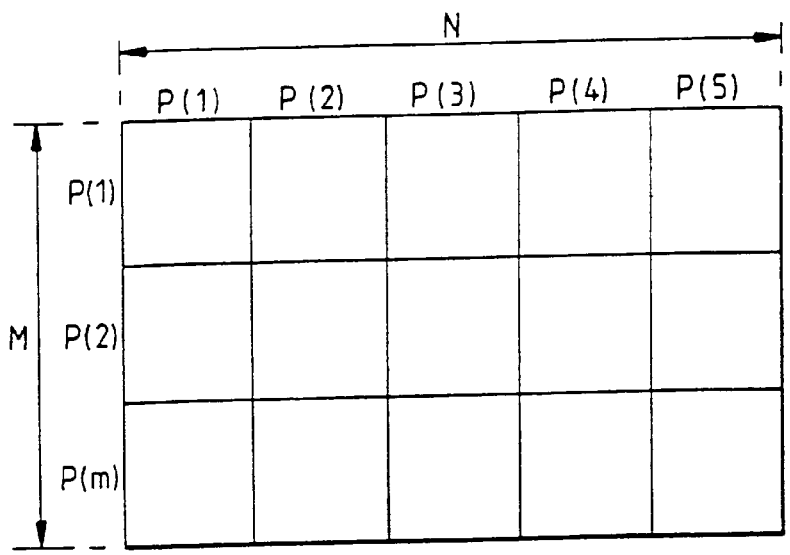
FIG. 1, an array representing a partition of the check matrix A.

To implement the process according to the present invention, the check matrix A is subdivided as shown in FIG. 1 into n submatrices of M rows and P columns or m×n square submatrices of P rows and P columns such that N=nP and M=mP, and n and m are mutually prime.

Figure 2:
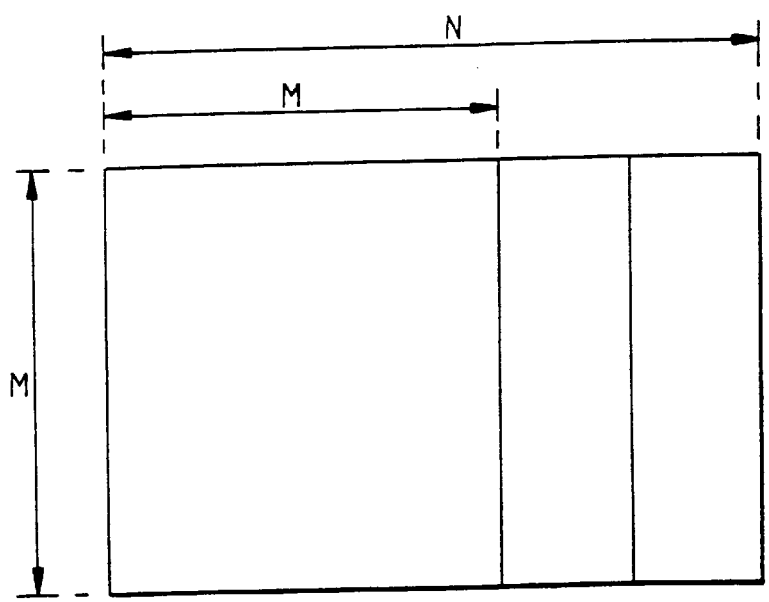
FIGS. 2 and 3, groupings of the $m^2$ left sub-matrices of the array of FIG. 1 into an M×M submatrix and (n—m) M×P submatrices.

The $m^2$ left submatrices are then grouped together as shown in FIG. 2 into an M×M submatrix (this will enable the coding algorithm to be greatly simplified) and the others into (n-m) M×P submatrices.

The construction process is described hereinbelow according to two variants, depending on whether m is equal to 1 or t.

The values of m is limited, however on account of condition "a", which demands that tr be an integer. Indeed, tr=t N/M, or else tr=t n/m.

n and m being mutually prime, m must divide t and can therefore only be equal to 1 or t for t prime and small (true for low values of t, namely 3, 5, 7).

Figure 3:
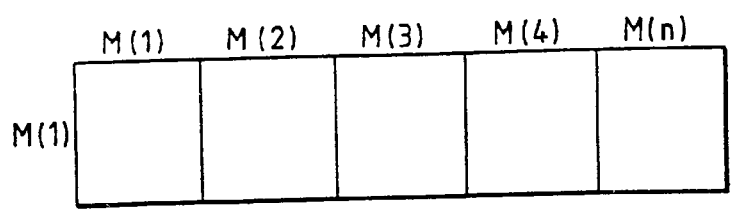

In the first variant where m=1 (codes with redundancy r/(r−1)), the process according to the invention is valid for codes with redundancy rate N/K of the form r/(r−1) where the number of redundancy symbols is exactly N/r(r integer). In this case, M is equal to P and the array of FIG. 2 reduces to the array of FIG. 3. The process then consists in searching for n sequences of length M comprising t "1"s and (M−t) "0"s.

These sequences hereinafter denoted w[0 . . . n−1] are obtained by:

a cyclic autocorrelation equal to 0, 1 or t (the shifted sequence i does not coincide with its unshifted self except at 0 or 1 point) such that for every i=0 . . . n−1:

$$\sum_{k=0\ldots M-1} w[i][k]w[i][k] = t \text{ (by definition)}$$

$$\sum_{K=0\ldots M-1} w[i][k]w[i][(k+p) \text{ modulo } M] = 0 \text{ or } 1,$$

$$\text{for } p = 1 \ldots M-1$$

a cyclic cross-correlation equal to 0 or 1 (the sequence i shifted or not does not coincide with the sequence j except at 0 or 1 point) such that for every pair {i,j} where i=0 . . . n−1 and j=0 . . . n−1 are different:

$$\sum_{K=0\ldots M-1} w[i][k]w[j][(k+p) \text{ modulo } M] = 0 \text{ or } 1, \text{ for } p = 0 \ldots M-1$$

The algorithm for computing the sequences w is very simple: it successively determines the positions pos[0][0 . . . t−1], pos[1][0 . . . t−1], . . . , pos[n−1][0 . . . t−1], where these sequences possess a "1", beginning with pos[x][0]=0, pos[x][1]=1, . . . , pos[x][t−1]=t−1, and by modifying them so as to satisfy the autocorrelation and cross-correlation conditions.

For t=3, the computation loops employed are shown in Appendix 1.

This algorithm fails when n is too large, given M: few "small" codes are found, but this is of little importance since one generally seeks codes of large size (N>>100).

The columns of the matrix A are then quite simply the vectors w circularly permuted:

kth submatrix (k=0 . . . n−1)

$$A[\text{row}][\text{column}]=w[k][(\text{row}-(\text{column}-kP)) \text{ modulo } M]$$

With:
row=0 . . . M−1
and column=kP . . . (k+1)P−1

Thus each row of A comprises exactly t nonzero values in each of the n submatrices, i.e. a total of n=tr.

Figure 4:
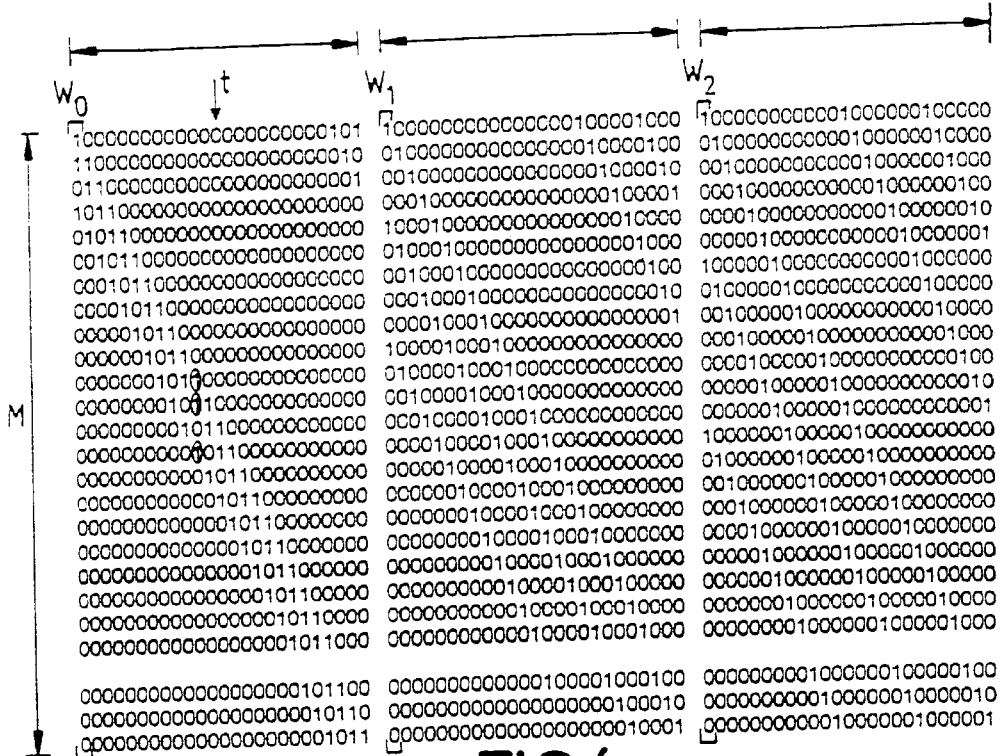
FIGS. 4 and 5, a check matrix A obtained respectively according to a first and a second variant execution of the process according to the invention.

An exemplary matrix A, obtained through this process for an LDPC code (75, 50, t=3, tr=9) with redundancy 3/2 (r=n=3) with P=25, is shown in FIG. 4. According to the array represented, it may be noted that:

w[0][i]=1 for i=0, 1, 3
w[1][i]=1 for i=0, 4, 9
w[2][i]=1 for i=0, 6, 13

The proposed construction guarantees that:
each column comprises exactly t nonzero values (by definition of the vectors w)
each row comprises exactly tr nonzero values (by virtue of the autocorrelation and cross-correlation properties of the vectors w)
every pair of distinct columns has at most one common nonzero value (ditto)
every pair of distinct rows has at most one common nonzero value (ditto)
According to a second variant inspired by the previous one corresponding to the case where m=t, the process according to the invention searches for n−m+1 sequences of length M comprising t "1"s and (M−t) "0"s, sequences denoted w[0 . . n−m].

The first sequence w[0] is obtained by:
a cyclic autocorrelation equal to 0, 1 or t the shifted sequence 0 does not coincide with its unshifted self except at 0 or 1 point) such that:

$$\sum_{K=0\ldots M-1} w[0][k]w[0][k] = t \text{ (by definition)}$$

$$\sum_{K=0\ldots M-1} w[0][k]w[0][(k+p) \text{ modulo } M] = 0 \text{ or } 1,$$

$$\text{for } p = 1 \ldots M-1$$

In fact, this is the same definition as for m=1.
The following sequences w[1 . . . n−m] are obtained by
a cyclic autocorrelation equal to 0 or t for multiple shifts by m (the sequence i shifted by a multiple of m never coincides with its unshifted self) such as:
for every i=1 . . . n−m:

$$\sum_{K=0\ldots M-1} w[i][k]w[i][k] = t \text{ (by definition)}$$

$$\sum_{K=0\ldots M-1} w[i][k]w[i][(k+pm) \text{ modulo } M] = 0, \text{ for } p = 1 \ldots P-1$$

by a cyclic cross-correlation equal to 0 or 1 with the sequence w[0] (the sequence i shifted or not does not coincide with the sequence 0 except at 0 or 1 point) such that:
for every i=1 . . . n−m:

$$\sum_{K=0\ldots M-1} w[i][k]w[0][(k+p) \text{ modulo } M] = 0 \text{ or } 1, \text{ for } p = 0 \ldots M-1$$

and by a cyclic cross-correlation with the sequences w[1 . . . n−m] equal to 0 or 1 for multiple shifts by m (the sequence i shifted or not by a multiple of m does not coincide with the sequence j except at 0 or 1 point) such that:
for every pair {i,j} where i=1 . . . n−m and j=1 . . . n−m are different:

$$\sum_{K=0\ldots M-1} w[i][k]w[j][(k+pm) \text{ modulo } M] = 0 \text{ or } 1, \text{ for } p = 0 \ldots P-1$$

The algorithm for computing the sequences w is the same as previously. Only the autocorrelation and cross-correlation criteria change, it being necessary to verify them only on P points instead of M.

The columns of the matrix A are then the vectors w circularly permuted with a step equal to 1 or m and such that:
M×M left submatrix of A:

$$A[\text{row}][\text{column}]=w[0][(\text{row}-\text{column}) \text{modulo } M]$$

With:
row=0 . . . M−1
column=0 . . M−1
M×P submatrices which follow (equal to n−m in number) for k=m . . . n−1:

$$A[\text{row}][\text{column}]=w[k-m+1][(\text{row}-m(\text{column}-kP)) \text{modulo } M]$$

With:
row= . . . M−1
column=kP . . . (k+1)P−1
Thus, each row of A comprises exactly m=t non-zero values in its first M columns, then 1 non-zero value in each of the n−m packets of P successive columns, i.e. a total of n or tr.

Figure 5:
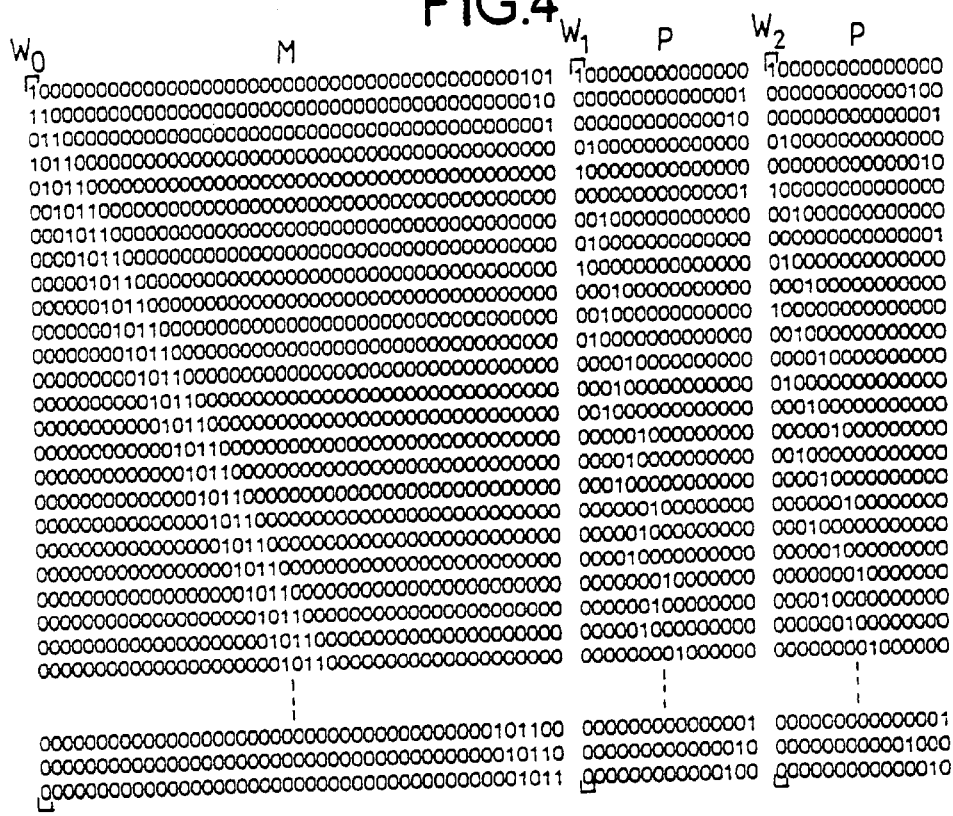

An exemplary matrix A, obtained according to the second variant of the process according to the invention, is shown in FIG. 5 for an LDPC code (75, 30, t=3, tr=5) with redundancy 5/2 (n=5, m=3) with P=15. In the array of FIG. 5 it may be noted that:

w[0][i]=1 for i=0, 1, 3
w[1][i]=1 for i=0, 4, 8
w[2][i]=1 for i=0, 5, 10

The process according to the invention, which has just been described under its two variants, leads directly to a very simple algorithm for coding redundancy symbols Yi and information symbols Xi.

For this, it is sufficient to regard the redundancy symbols Yi as being the first M symbols of a code word, and the free symbols Xi (information) as being the last N−M symbols.

The equations which must be satisfied by every code word may therefore be rewritten in the form:

$$\sum_{i=0 \ldots M-1} Ami\ Yi + \sum_{i=M \ldots N-1} Ami\ Xi = 0, \text{ for } m = 0 \ldots M-1$$

or else:

$$\sum_{i=0 \ldots M-1} Ami\ Yi = Zm, \text{ for } m = 0 \ldots M-1$$

with $$Zm = -\sum_{i=M \ldots N-1} Ami\ Xi, \text{ for } m = 0 \ldots M-1$$

The process then consists in calculating firstly the M quantities Zm of the switching matrix, and thereafter the redundancy symbols:

$$Ym = \sum_{i=0 \ldots M-1} Bmi\ Zi, \text{ for } m = 0 \ldots M-1$$

Figures 6, 7:
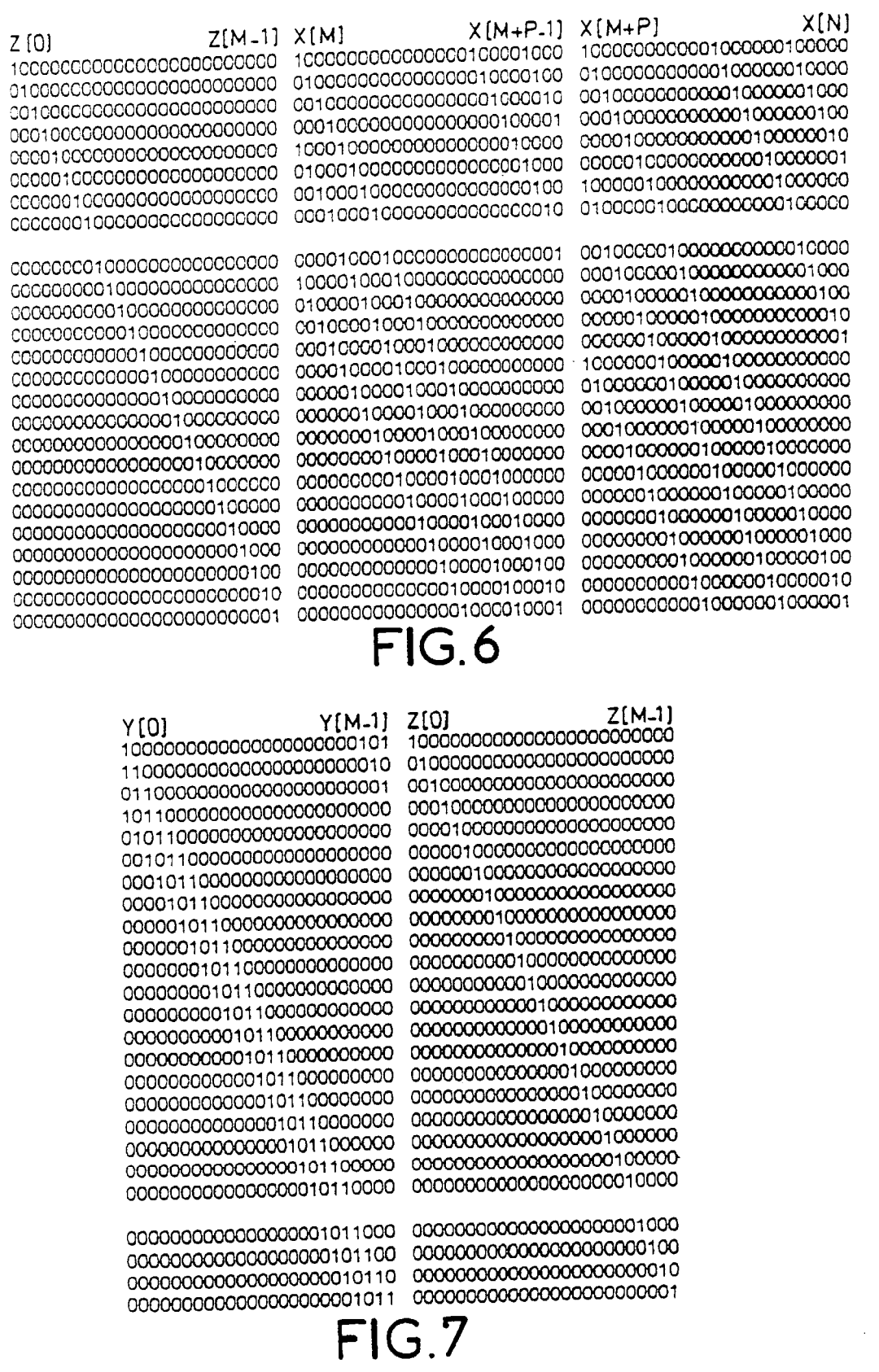

By way of example, for the (75, 50) LDPC code, the quantities Zm are calculated via the equation system defined by the array of FIG. 6 which, after solution, is transformed into the array of redundancy symbols of FIG. 7.

The matrix B, with generic element Bij, is the inverse of the left part $A_M$ (of dimension M×M) of the matrix A. It has a very simple form: by construction, all its columns are circular permutations of the sequence w[0] [0 . . M−1]:

$Aij=w[0][(i-j) \text{ modulo } M], i=0\ldots M-1, j=0\ldots M-1$

The matrix B then comprises M rows which are circular permutations of a single row b[0 . . . M−1), namely:

$Bij=b[(j-i) \text{ modulo } M]$

B being the inverse of $A_M$, the coefficients b are defined by:

$$\sum_{i=0 \ldots M-1} w[0][i]b[(i+k) \text{ modulo } M] = 1 \text{ if } k=0,\ 0 \text{ if } k=1 \ldots M-1$$

Figures 8, 9:
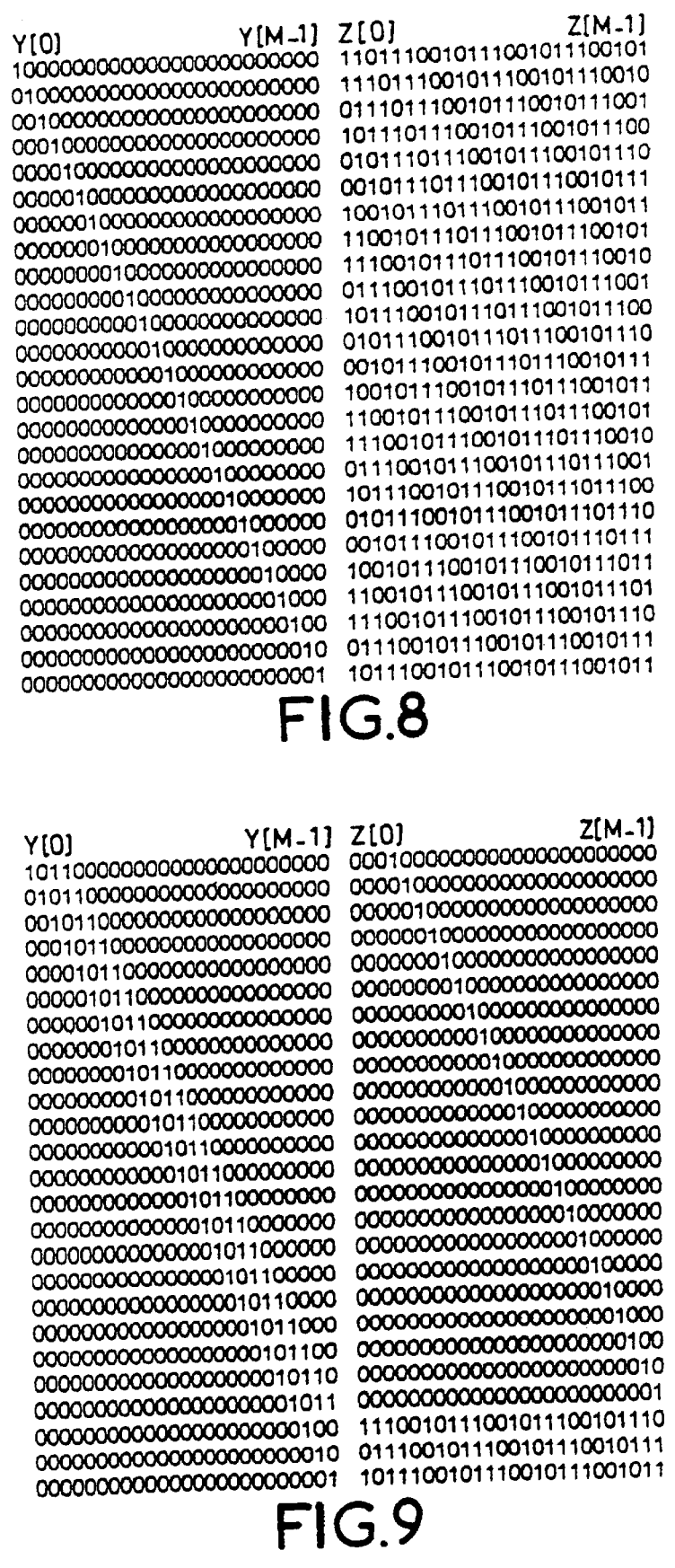

For example, for the (75, 50) LDPC code, the redundancy coefficients Ym are calculated via the system of equations defined by the array of FIG. 8 which after solution is transformed into the array of FIG. 9.

However, there are cases where the calculation is impossible.

It is in fact possible to write the equations which define them in the form:

$${}^tA_M t\{b[0], b[1], \ldots, b[M-1]\} = t\{1, 0, 0, \ldots, 0\}$$

The matrix ${}^tA_M$ is a circulant matrix, whose first row is equal to a[0 . . . M−1]=w[0].

Its determinant is equal to the product of its M eigenvalues |0 . . . M−1

The kth eigenvalue is itself given by:

$$\lambda_k = \sum_{i=0 \ldots M-1} a[i]\alpha_{ik}$$

where α is an Mth root of unity.

For example:
for w[0]=a[0 . . . M−1]={1, 1, 0, 1, 0, 0, 0, . . . }
for binary codes (these lie in the Galois field CG(2) where addition is equivalent to EXCLUSIVE OR (XOR) and multiplication to logical AND)
we have:

$\lambda_1 = 1 + \alpha 30\ \alpha^3$.

If M is a multiple of 7, it is found that the equation $1+\alpha+\alpha^3=0$ defines a Galois field where α is a 7th root of unity (the polynomial $g(x)=1+x+x^3$ is irreducible and primitive in CG(2) and generates a Galois field CG(23)), which implies that $\lambda_1=0$.

Among the LDPC codes found by the proposed algorithm, it is therefore necessary to eliminate those where M is a multiple of 7 if we retain this w[0] since:
one of the eigenvalues of ${}^tA_M$ will be zero
its determinant will therefore be zero
it will therefore not be possible to find suitable values b[i]
it will therefore not be possible to perform the coding (to calculate the Yi)

Very generally, regardless of the choice made for w[0], there will be values of M which are not suitable since they do not allow the coding to be carried out.

It may be easily shown by factorizing $$x^M - 1 \text{ and } a(x) = \sum_{i \ldots M-1} a[i]\ x^k$$

that these values of M are the multiples of a value MO for which a(x) divides xMO−1.

For example, for binary codes with t=3:
w[0]={1, 1, 0, 1, . . . }
w[0]={1, 0, 1, 1, . . . }
forbid M a multiple of 7 (a(x) defines a 7th root of unity)
w[0]={1, 1, 0, 0, 1, . . . }
w[0]={1, 0, 0, 1, 1, }
forbid M a multiple of 15 (a(x) defines a 15th root of unity)
w[0]={1, 0, 1, 0, 1, . . . } is not accepted (incorrect autocorrelation)
w[0]={1, 1, 0, 0, 0, 1,
w[0]={1, 0, 0, 0, 1, 1, . . . }
forbid M a multiple of 3 (a(x) is a multiple of 1+x+x2 which defines a cube root of unity)

w[0]={1, 0, 1, 0, 0, 1, ... } w[0]={1, 0, 0, 1, 0, 1, } forbid M a multiple of 31 (a(x) defines a 31st root of unity)

The coefficients b[i] are calculated as follows:

For a nonforbidden value of M, there is a particularly simple algorithm for computing the b[i] from the a[i] (or w[0]0 ... M−1]).

This algorithm relies on the observation that the series of b[i], after periodization and filtering by a finite impulse response filter (FIR) A(z) whose coefficients are the a[M−1, M−2, ... , 1, 0], must give the periodized series {1, 0, 0, ... }. In fact, for a binary code using one of the w[0] enumerated previously, this series is formed by the concatenation of maximal sequences (Maximal Length Sequences) of length 7 (or 15 or 31 or 63).

The impulse response of the infinite impulse response filter (IIR) 1/A(z) is therefore calculated and a slice of length M is extracted therefrom which, once periodized, gives the series {1, 0, 0, ... } after filtering by A(z).

For example, for a binary code with t=3 and for which only a[0], a[k1] and a[k2] are not zero, a corresponding algorithm is provided in Appendix 2.

With the aim of simplification so as not to perform the previous calculation at each coding, the coding algorithm can even be defined by the last k2 elements b[M−K2 ... M−1] which, by recurrence (filtering by 1/A(z)), make it possible to recalculate all the others.

Likewise as the second phase of the standard coding algorithm (calculation of the Y from the Z) comprises on average $M^2/2$ operations, which may become considerable for sizable codes: the complexity being a quadratic function of size, and since, moreover, it is necessary to store the intermediate array z (M elements) and to know the array b (M elements also) if it is not calculated there and then, this part of the algorithm can be modified so as to use only two intermediate arrays of very small size by thus rewriting the equations giving the Y in the manner shown by the array of FIG. 9 (example for a (75, 50) LDPC code):

The first M−k2 (for t=3) rows are the last M−k2 rows of the system of equations giving Y, before solution.

The last k2 rows are the last k2 rows of the system of equations giving Y, after solution.

It is then sufficient to calculate the Y in reverse order, namely Y[M−1], Y[M−2], ... , Y[0].

The number of operations to be performed is then on average k2 M/2 (calculation of Y[M−1] ... Y[M−k2]) followed by t(M−k2) (calculation of all the others) i.e. approximately (t +k2/2)M: the complexity is now only a linear function of size.

The algorithm uses X[M ... n] as input.

The bottom part of X (X[0 ... M−1]) is used as temporary storage for the Z: X[0 ... M−1] stores Z[k2 ... M−1, 0 ... k2−1] so as to avoid a circular shift in the final phase.

The b[i] are calculated iteratively there and then, from the b[M−k2 ... M−1].

The code is defined by two arrays:

the array endB[0 ... k2−1] of the last k2 elements of b the array pos[0 ... (n−m+1)t] containing the positions of the non-zero elements of the sequences w[0], w[1], , w[n−m].

Two internal buffers of size k2 are used:

reg[0 ... k2−1] to calculate the b[i]

temp[0 ... k2−1] to store the intermediate values of Y[M−k2 ... M−1].

The complete algorithm for fast coding is then that shown in Appendix 3.

These algorithms are very simple to implement. Among other things, they have the characteristic of defining a code by very few parameters, namely the (n−m+1) (t−1) non-zero positions of the "1"s in the sequences w and possibly k2 coding coefficients. Even though they do not give all the possible codes meeting the conditions a-d (for example, not the (150, 125) code with redundancy 6/5, which requires n=6 sequences w of length P=25), they give enough of them so that, in any application where N and K are defined a priori, one can find either an (NLDPC, KLDPC) code with NLDPC=N and KLDPC=K an (NLDPC+d, KLDPC+d) neighboring code, with d small, which will be shortened by nontransmission of d useful symbols arbitrarily set to zero.

For example, to obtain a code (N, K) of redundancy 5/3 (rate 0 .6), it is sufficient to start from an (NLDPC+d, KLDPC+d) code of redundancy 8/5 (rate 0 .625) with d=NLDPC/15. For values of N less than or equal to 500 and t=3, it is possible very rapidly to construct 932 different codes with the following redundancies (we have deliberately limited ourselves to redundancies lying between 4 and 8/7, and to codes where w[0]=1, 1, 0, 1, 0, 0, 0, } for which k2=3):

| | | | |
|---|---|---|---|
| R = 4/1 | i.e. | 4.000 | (105 codes) |
| R = 5/2 | i.e. | 2.500 | (82 codes) |
| R = 6/3 or 2/1 | i.e. | 2.000 | (203 codes) |
| R = 7/4 | i.e. | 1.750 | (55 codes) |
| R = 8/5 | i.e. | 1.600 | (47 codes) |
| R = 9/6 or 3/2 | i.e. | 1.500 | (124 codes) |
| R = 10/7 | i.e. | 1.428 | (34 codes) |
| R = 11/8 | i.e. | 1.375 | (28 codes) |
| R = 12/9 or 4/3 | i.e. | 1.333 | (84 codes) |
| R = 13/10 | i.e. | 1.300 | (20 codes) |
| R = 14/11 | i.e. | 1.273 | (17 codes) |
| R = 15/12 or 5/4 | i.e. | 1.250 | (56 codes) |
| R = 16/13 | i.e. | 1.231 | (11 codes) |
| R = 17/14 | i.e. | 1.214 | (7 codes) |
| R = 18/15 or 6/5 | i.e. | 1.200 | (34 codes) |
| R = 19/16 | i.e. | 1.187 | (3 codes) |
| R = 20/17 | i.e. | 1.176 | (2 codes) |
| R = 21/18 or 7/6 | i.e. | 1.167 | (17 codes) |
| R = 24/21 or 8/7 | i.e. | 1.143 | (3 codes) |

Moreover, still for a given value of N less than or equal to 500, there can be up to 12 different codes (for N=480).

For example, as soon as N is a multiple of 6 and greater than or equal to 288, there always exist three codes of length N and of redundancies 6/5, 3/2 and 2/1, for example LDPC (300, 250)+LDPC (300, 200)+LDPC(300, 150).

This is very useful for effectively protecting a binary train formed of three binary trains each of length N and of different sensitivities. of course, it is always possible to envisage numerous variants of these algorithms, such as for example a random permutation of the rows and/or columns of the matrix A.

It is also important to point out that the adaptation to nonbinary codes is particularly simple.

APPENDIX 1

```
for(x=0; x<n − m + 1; x++){
  pos[x] [0] =0;
  for(pos[x] [1]=pos[x] [0]+1; pos[x] [1]<M−1;
  pos[x] [1]++) {
```

APPENDIX 1-continued

```
        for(pos[x] [2]=pos[x] [1]+1; pos[x] [2]<M;
    pos[x] [2]++) {
            (if the conditions are not satisfied,
                continue
                otherwise, go to ok)
        }
    }
    (stop: impossible to find a suitable choice
    for pos[x] [0...t-1])
ok:;
}
```

APPENDIX 2

(language C: the operator "^" corresponds to EXCLUSIVE OR.
```
    /* Initialization of the b pass, of length M*/
    for(i=M-k2; i<M; i++)
        b[i]=0;
    /* Calculation of N successive values of the
    impulse response of 1/A(z)*/
    b[0] = 1;
    for(i=1; i<k2; i++)
        b[i] = b[(i+M-(k2-k1)) % M]^b[(i+M-k2) % M];
    for(i=k2; i<M; i++)
        b[i] = b[i-(k2-k1)]^b[i-k2];
    /* Arrange for there to be just one 1
    in the last k2 positions of b filtered by A(z)*/
    weight = 0; /* all except 1 */
    while(weight != 1){
        /* Shift by one notch */
        for(i=1; i<M; i++)
            b[i-1] = b[i];
        b[M-1] = b[M-1-(k2-k1)]^b[M-1-k2];
        /* Verify */
        weight = 0;
        for(i=M-k2; i<M; i++){
            char sum = b[i]^b[(i+k1)%M]^b[(i+k2)%M];
            if(sum) {
                shift = M - i;
                weight++;
            }
        }
    }
    /* Particular case where M is forbidden */
    if(weight ==0)
        return (M_FORBIDDEN);
}
/* rightward final circular shift:
b[i]=b[(i - shift) % M]*/
for(dec=0; dec<shift; dec++){
    char temp = b[M-1];
    for(i=M-1; i>0; i--)
        b[i]=b[i - 1];
    b[0] = temp;
}
return(OK);
```

APPENDIX 3

(language C):
```
    /* Phase 1: calculation of M intermediate
parities z.
    These parities are calculated by reading the
successive columns of the coding matrix, namely
A[*] [M], . . . ,A[*] [N]
    They are placed at the head of x temporarily */
        #define    z    x
        for(i=0; i<M; i++)
            z[i] = 0;
        /* Loop over the n-m right submatrices of A*/
        c0 = M;
        c1 = c0 + P;
        for(k = 1; k<=n - m; k++){
            offset = 0;
```

APPENDIX 3-continued

```
            for(c=c0; c<c1; c++){
                if(x[c]!=0)
                    for(i=0; i<t; i++){
                        /* p    ought    to    be
                        offset + pos[i].
                        We decrement it by k2 to avoid
shifting
                        the array z before phase 3*/
                        p = offset + pos[k*t+i] - k2;
                        if (p<0)
                            z[p + M] = z[p + M]^1;
                        else
                            if (p<M)
                                z[p] = z[p]^1;
                            else
                                z[p - M]=z[p - M]^1;
                    }
                offset = offset + m;
            }
            c0 = c1;
            c1 = c1 + P;
    }
    /* Phase 2: calculation of the last k2 parity
symbols */
    ixb0 = M - 1 - k2;
    /*1: initialization of the last k2 elements of y
    temp[0 . . . k2-1]=y[M-1, M-k2]*/
    for(k=0; k<k2; k++)
        temp[k] = 0;
    /*2: copy over the last k2 elements of b
    reg[0 . . . k2-1] = b[M-k2 . . . M-1]*/
    for(i=0; i<k2; i++)
        reg[i] = finB[i];
    /*3: iterative calculation of the last k2 symbols
    */
    for(i=0; i<M; i++){
        /* b[i] = [1 0 0 . . . }^b[i-(k2-k1)]^b[i-k2]
        with b[i-k2) . . . b[i-1] = reg[0 . . . t2-1]
            We must verify that:
            b[-k2] + b[k1-k2] + b[0] = 0
            . . .
            b[-2] + b[k1-2] + b[k2-2] = 0
            b[-1] + b[k1-1] + b[k2-1] = 0
            b[0] + b[k1] + b[k2] = 1
            b[1] + b[1+k1] + b[1+k2] = 0
            . . . */
        if(i==k2)
            input = 1;
        else
            input = 0;
        bi = input^reg[0]^reg[k1];
        for(k=1; k<k2; k++)
            reg[k - 1] = reg[k];
        reg[k2 - 1] = bi;
        if(bi != 0)
            for(k=0; k<k2; k++)
                if(z[(ixb0 - k + M) % M]!=0)
                    temp[k] = temp[k]^1;
        ixb0 = ixb0 + 1;
        if (ixb0==M)
            ixb0 = 0;
    }
    /*4: The z values have already been left-shifted
    to avoid overwriting. Otherwise, it would be
    necessary to do:
    for(k=0; k<M - k2; k++)
        z[k] = z[k + k2];
    Copy over temp to the end of y */
#define y    x
    for(k=0; k<k2; k++)
        y[M - 1 - k] = temp[k];
    /* Phase 3: calculation of y[M-k2-1, M-k2-2, . . . ,0]
    y[k+k2-k2] + y[k+k2-k1] + y[k+k2-0] + z[k+k2] = 0
    y[k] goes to x[k]
    z[k+k2] is in x[k]
    Hence:
    x[k+k2-k2] + x[k+k2-k1] + x[k+k2-0] + x[k] = 0
    i.e.:
    x[k+k2-k2] = -(x[k+k2-k1] + x[k+k2] + x[k])
```

APPENDIX 3-continued

```
*/
for(k = M-k2-1; k>=0; k--)
    y[k] = y[k+k2-k1]^y[k+k2]^z[k];
```

What is claimed is:

1. A method for constructing low density parity check (LDPC) codes for protecting binary information trains, each train being composed of N symbols decomposed into N−M useful information symbols $X_i$ and M redundancy information symbols $Y_m$, each code being defined by a check matrix A comprising M<N rows of N columns and t nonzero symbols in each column, comprising:

allocating a same number of nonzero symbols to each row of the check matrix A;

setting t equal to an odd number;

defining the columns of the check matrix A such that any two columns of the check matrix A have a nonzero value in at most one common position; and defining the rows of the check matrix A such that any two rows of the check matrix A have a nonzero value in only one common position.

2. The method of claim 1, further comprising:

subdividing the check matrix A of M rows and N columns into n submatrices of M rows and P columns to form n×m smaller submatrices of P rows and P columns and grouping together $m^2$ left-most smaller submatrices into an M×M submatrix and remaining smaller submatrices into n−m M×P submatrices; and determining M×n sequences of column vectors w[0 . . . n−1] of length M comprising t nonzero values and (M−t) zero values by performing an autocorrelation and a cyclic cross-correlation of the column vectors w.

3. The method of claim 1, further comprising:

subdividing the check matrix A of M rows and N columns into n submatrices of M rows and P columns to form n×m smaller submatrices of P rows and P columns, and grouping together $m^2$ left—most smaller submatrices into an M×M submatrix and any remaining smaller submatrices into n−m M×P submatrices;

determining n−m+1 sequences of column vectors w[0 . . . n−m] of length M comprising t nonzero values and (M−t) zero values, wherein a first sequence w[0] is obtained by a cyclic autocorrelation equal to 0, 1, or the value t such that the shifted sequence w[0] does not coincide with an unshifted version of w[0] except at at most one point; and the n−m sequences w[i] [k] are obtained:

by a cyclic autocorrelation of value zero or the value t such that a value of the sequence w[i] shifted by a multiple of m never coincides with an unshifted version of w[i], and by a cyclic crosscorrelation of value zero or one with the sequence w[1 . . . n−m] for multiple shifts by m such that a sequence i shifted or not by a multiple of m does not coincide with a sequence j except in at most one point.

4. The method of any one of claims 1 to 3, further comprising:

determining, for a coding of the useful information $X_i$, a switching matrix $Z_m$ equal to a product of the check matrix A times a column vector representing the N−M information symbols $X_i$; and appending, to the information symbols, redundancy symbols $Y_m$ obtained as a result of a product of the switching matrix $Z_m$ times a matrix B equal to an inverse of an M×M submatrix of the check matrix A.

* * * * *